United States Patent
Brox

(10) Patent No.: US 7,420,867 B2
(45) Date of Patent: Sep. 2, 2008

(54) SEMICONDUCTOR MEMORY DEVICE AND METHOD FOR OPERATING A SEMICONDUCTOR MEMORY DEVICE

(75) Inventor: Martin Brox, Munich (DE)

(73) Assignee: Infineon Technologies AG, Munich (DE)

(*) Notice: Subject to any disclaimer, the term of this patent is extended or adjusted under 35 U.S.C. 154(b) by 43 days.

(21) Appl. No.: 10/569,859

(22) PCT Filed: Jul. 9, 2004

(86) PCT No.: PCT/EP2004/051433

§ 371 (c)(1),
(2), (4) Date: Dec. 7, 2006

(87) PCT Pub. No.: WO2005/024837

PCT Pub. Date: Mar. 17, 2005

(65) Prior Publication Data

US 2007/0153615 A1 Jul. 5, 2007

(30) Foreign Application Priority Data

Aug. 28, 2003 (DE) ............... 103 39 665

(51) Int. Cl.
  *G11C 8/00* (2006.01)
(52) U.S. Cl. .............. 365/230.03; 365/230.06
(58) Field of Classification Search ............ 365/230.03, 365/230.06
See application file for complete search history.

(56) References Cited

U.S. PATENT DOCUMENTS 5,831,928 A 11/1998 Nakano et al.

6,031,783 A 2/2000 Proebsting (Continued)

FOREIGN PATENT DOCUMENTS

EP  0902434  3/1999

OTHER PUBLICATIONS

Shiratake S et al.: "A Pseudo Multi-Bank DRAM with Gategorized Access Sequence" 1999 Symposium on VLSI Circuits. Digest of Technical Papers. KYOTO, Jun. 17-19, 1999, Symposium on VLSI Circuits, New York, NY: IEEE, US, Bd. Conf. 13, Jun. 17, 1999, Seiten 127-130, XP000894784 ISBN: 0-7803-5441-9.

*Primary Examiner*—Tuan T. Nguyen
(74) *Attorney, Agent, or Firm*—Dicke, Billig & Czaja, PLLC

(57) ABSTRACT

A method for operating a semiconductor memory device is disclosed. In one embodiment, the method includes activating a first memory cell sub-array or memory cells of the first memory cell sub-array that are contained in a first set of memory cells, in particular of memory cells positioned in one and the same row or column of the first memory cell sub-array, if one or a plurality of memory cells contained in the first memory cell sub-array or in the first set of memory cells is/are to be accessed. The corresponding memory cell or memory cells are accessed; including leaving the first memory cell sub-array or the memory cells of the first memory cell sub-array that are contained in the first set of memory cells in the activated state if one or a plurality of further memory cells is/are to be accessed which are contained in a second memory cell sub-array of the same memory cell array that comprises the first memory cell sub-array.

20 Claims, 4 Drawing Sheets

U.S. PATENT DOCUMENTS

| | | |
|---|---|---|
| 6,084,816 A | 7/2000 | Okamura |
| 6,091,624 A * | 7/2000 | Kang ......................... 365/145 |
| 6,134,172 A | 10/2000 | Barth et al. |
| 6,496,442 B2 * | 12/2002 | Koyanagi et al. ...... 365/230.03 |
| 6,922,352 B2 * | 7/2005 | Kang ......................... 365/145 |
| 2001/0021138 A1 | 9/2001 | Kaneko et al. |
| 2002/0114209 A1 * | 8/2002 | Koyanagi et al. ...... 365/230.03 |
| 2004/0066700 A1 * | 4/2004 | Lee et al. ..................... 365/232 |

* cited by examiner

SEMICONDUCTOR MEMORY DEVICE AND METHOD FOR OPERATING A SEMICONDUCTOR MEMORY DEVICE

CROSS-REFERENCE TO RELATED APPLICATION

This Utility Patent Application claims the benefit of the filing date of application Ser. No. DE 103 39 665.9, filed Aug. 28, 2003, and International Application No. PCT/EP2004/05 1433 filed Jul. 9, 2004, both of which are herein incorporated by reference.

FIELD OF THE INVENTION

The invention relates to method for operating a semiconductor memory and to a semiconductor memory device.

BACKGROUND

In the case of semiconductor memory devices one differentiates between so-called functional memory devices (e.g., PLAs, PALs, etc.), and so-called table memory devices, e.g., ROM devices (ROM=Read Only Memory) and RAM devices (RAM=Random Access Memory or read-write memory, respectively).

A RAM device is a memory for storing data under a predetermined address and for reading out the data under this address again later.

The corresponding address can be input into the RAM device via so-called address pins or address input pins. A plurality of, e.g. 16, so-called data pins or data input/output pins (I/Os or inputs/outputs) are provided for the input and output of the data. By applying an appropriate signal (e.g. a read/write signal) at a write/read select pin it can be selected whether (at the moment) data are to be stored or to be read out. Since as many memory cells as possible are intended to be accommodated in a RAM device, one has been trying to realize same as simple as possible. In the case of so-called SRAMs (SRAM=Static Random Access Memory), the individual memory cells consist e.g. of few, for instance 6, transistors, and in the case of so-called DRAMs (DRAM=Dynamic Random Access Memory) in general only of one single, correspondingly controlled capacitor with the capacitance of which one bit each can be stored as charge. This charge, however, remains for a short time only. Therefore, a so-called "refresh" must be performed regularly, e.g. approximately every 64 ms.

In the case of memory devices, in particular DRAM devices, the individual memory cells are—positioned side by side in a plurality of rows and columns—arranged in a rectangular matrix or a rectangular array for technological reasons.

In order to obtain a correspondingly high total storage capacity and/or to achieve a data read or write rate that is as high as possible, a plurality of, e.g., four—substantially rectangular—individual arrays (so-called "memory banks") may be provided in one single RAM device or chip ("multi-bank chip") instead of one single array.

To perform a write or read access, a particular predetermined sequence of instructions has to be run through:

For instance, by means of a word line activate instruction (activate instruction (ACT)) a corresponding word line—that is in particular assigned to a particular individual array ("memory bank")—(and that is defined by the row address ("row address") is first of all activated.

Subsequently—by means of a corresponding read or write instruction (RD or WT instruction)—it is initiated that the corresponding data—which are then exactly specified by the corresponding column address—are correspondingly output (or read in).

Next—by means of a word line deactivate instruction (e.g., a precharge instruction (PRE instruction) the corresponding word line is deactivated again, and the corresponding array ("memory bank") is prepared for the next word line activate instruction (ACT).

In order to ensure a faultless operation of the DRAM device, particular time conditions have to be observed.

A particular time interval tRCD (so-called RAS-CAS delay) must, for instance, lie between the word line activate instruction (ACT instruction) and a corresponding read (or write) instruction (RD (or WT) instruction). The RAS-CAS delay results, for instance, from the time required by the sense amplifiers for amplifying the data supplied by the memory cells addressed by the word line.

Correspondingly, a corresponding time interval tRP (so-called "row precharge time" delay) also must be observed between a word line deactivate instruction (PRE instruction) that follows the read (or write) instruction (RD (or WT) instruction) and a subsequent word line activate instruction (ACT instruction).

By the—above-explained—providing of a plurality of independent arrays ("memory banks") in one single DRAM device—for which corresponding word line activate and deactivate instructions, etc. are generated by a corresponding memory device controller ("memory controller") independently of each other—, the delay times that result altogether for the device during the writing or reading of data can be reduced, and thus the performance of the DRAM device can be increased (for instance, since corresponding write or read accesses can be performed in parallel or overlapping in time, respectively, with a plurality of different arrays ("memory banks")).

In order to further increase the performance of a corresponding DRAM device, the corresponding memory device controller ("memory controller") may—after the output of a corresponding word line activate instruction (ACT instruction) and of a corresponding read (or write) instruction (RD (or WT) instruction)—leave the respective word line first of all in an activated state (i.e. the corresponding word line deactivate instruction (PRE instruction) may first of all be inhibited).

If then—which is, from a statistic point of view, the case very frequently—in the corresponding array ("memory bank") (a) memory cell(s) is/are accessed next which is/are assigned to the same word line or row as the memory cell(s) that was/were accessed last, the output of a further word line activate instruction (ACT instruction) can be omitted.

Instead, the memory device controller ("memory controller") may directly output a corresponding read (or write) instruction (RD (or WT) instruction) to the respective array ("memory bank") and thus it may be achieved that the corresponding data are read out (or input) instantly—without a corresponding RAS-CAS delay tRCD occurring.

Only if—which is, from a statistic point of view, the case less frequently—in the corresponding array ("memory bank") (a) memory cell(s) is/are to be accessed next which is/are assigned to a different word line or row than the memory cell(s) which was/were accessed last—, the corresponding—last used—word line is deactivated by the output of a corresponding word line deactivate instruction (PRE instruction), and then the—new—word line is activated (by the output of a corresponding, further word line activate instruction (ACT instruction)).

SUMMARY

The present invention provides a novel method for operating a semiconductor memory device, and a novel semiconductor memory device.

BRIEF DESCRIPTION OF THE DRAWINGS

In the following, the invention will be described by means of an embodiment and the enclosed drawing.

DETAILED DESCRIPTION

Figure 1:
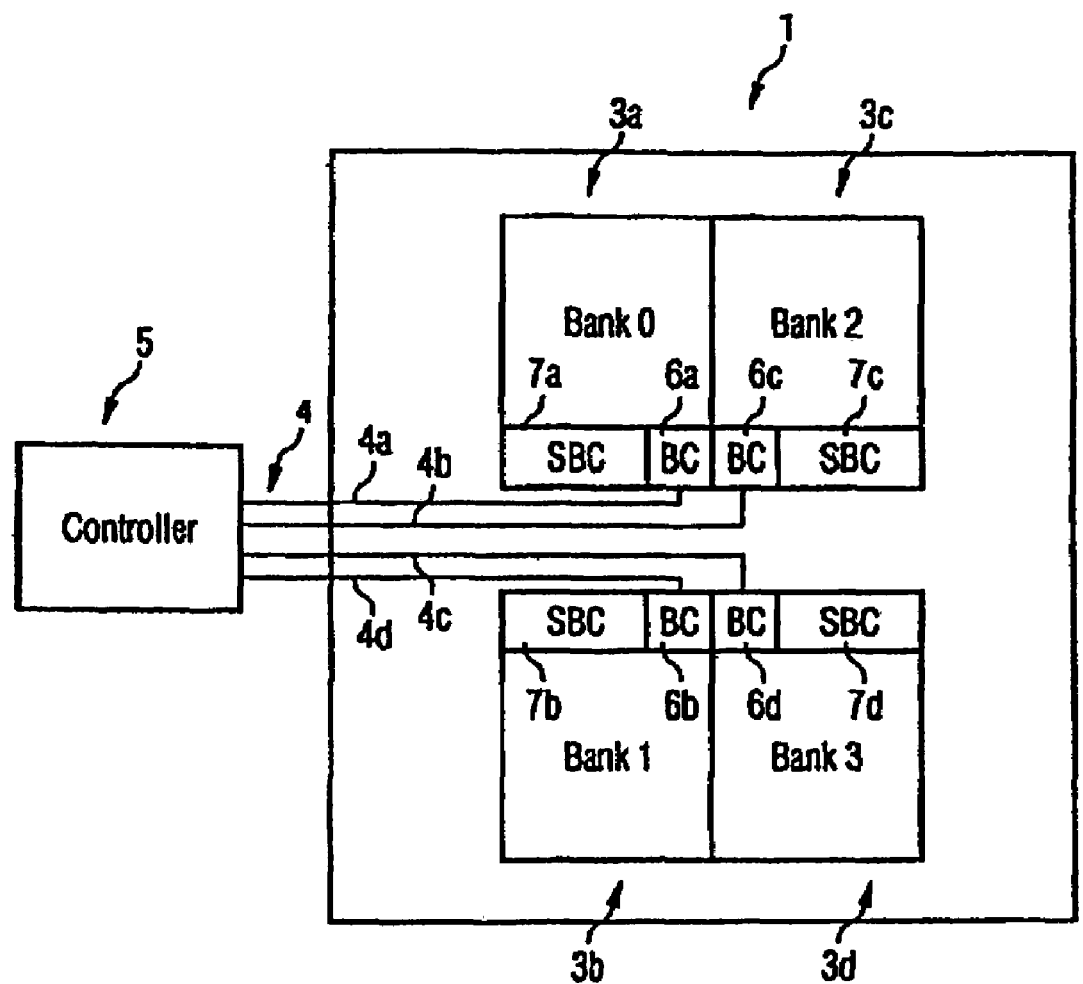
FIG. 1 illustrates a schematic representation of the structure of a semiconductor memory device with a plurality of arrays, and of a memory device controller according to an embodiment of the present invention.

FIG. 1 illustrates a schematic representation of the structure of a semiconductor memory device 1 or semiconductor memory chip, respectively, and of a—central—memory device controller 5 according to an embodiment of the present invention.

The semiconductor memory device 1 may, for instance, be a—CMOS-based—table memory device, e.g., a RAM memory device (RAM=Random Access Memory or read-write memory, respectively), in particular a DRAM memory device (DRAM=Dynamic Random Access Memory or dynamic read-write memory, respectively).

In the semiconductor memory device 1—after the input of a corresponding address (e.g., by the memory device controller 5)—data can be stored under the respective address and read out under this address again later.

The address may be input in a plurality of, e.g., two, successive steps (e.g., first a row address—and possibly parts of a column address (and/or possibly further address parts, or parts thereof (cf. below))—and then the column address (or the remaining parts of the column address, and/or—only now—the above-mentioned further address parts (or the remaining parts thereof) (cf. below)), etc.).

By the applying of a corresponding control signal (e.g., a read/write signal)—e.g., by the memory device controller 5—it can be selected whether data are to be stored or to be read out.

The data input into the semiconductor memory device 1 are, as will be explained in more detail in the following, stored in corresponding memory cells there, and are read out from the corresponding memory cells again later.

Each memory cell consists, for instance, of few elements, in particular of only one single, correspondingly controlled capacitor, with the capacitance of which one bit each can be stored as charge.

As results from FIG. 1, a particular number of memory cells—each positioned side by side in a plurality of rows and columns—are each arranged in a rectangular or square array ("memory bank") 3a, 3b, 3c, 3d, so that—corresponding to the number of memory cells contained—e.g., 32 MBit, 64 MBit, 128 MBit, 256 MBit, etc. each can be stored in one array 3a, 3b, 3c, 3d.

As is further illustrated in FIG. 1, the semiconductor memory device 1 comprises a plurality of, e.g., four, memory cell arrays 3a, 3b, 3c, 3d (here: the memory banks 0-3) which are of substantially identical structure and are distributed evenly over the area of the device—and are controlled by the above-mentioned memory device controller 5 substantially independently of each other—, so that a total storage capacity of e.g. 128 MBit, 256 MBit, 512 MBit, or 1024 MBit (or 1 GBit) correspondingly results for the semiconductor memory device 1.

By the providing of a plurality of substantially independent arrays 3a, 3b, 3c, 3d it can be achieved that corresponding write or read accesses can be performed—in parallel or overlapping in time—with a plurality of different arrays 3a, 3b, 3c, 3d.

The above-mentioned address (input into the semiconductor memory device 1 or the semiconductor device controller 5, respectively) contains—as part of the above-mentioned further address parts—a corresponding number of (here e.g. two) bits ("array select bits" or "bank address bits") serving to address the respectively desired array 3a, 3b, 3c, 3d during the storing or reading out of data.

As will be explained in more detail in the following, and as is, for instance, illustrated in FIG. 2, each of the arrays 3a, 3b, 3c, 3d comprises a particular number of (e.g., between 10 and 100, in particular between 20 and 70, for instance, between 30 and 40, e.g., 32) sub-arrays 8a, 8b, 8c, 8d ("sub-banks" 8a, 8b, 8c, 8d).

The sub-arrays 8a, 8b, 8c, 8d are each of substantially identical structure, are of substantially rectangular design, and each include a particular number of memory cells that are each positioned side by side in a plurality of rows and columns.

Between two respective sub-arrays 8a, 8b, 8c, 8d (and between the sub-array 8a and an adjacent—here also substantially rectangular—decoding/data amplifier region 11) there are positioned respective—here also substantially rectangular—sense amplifier regions 10a, 10b, 10c, 10d.

In each of the sense amplifier regions 10a, 10b, 10c, 10d, a plurality of sense amplifiers are arranged, wherein the corresponding sense amplifiers (or, more exactly: the sense amplifiers positioned in the sense amplifier regions 10b, 10c arranged between two respective different sub-arrays 8a, 8b, 8c, 8d) are assigned to two respective different sub-arrays 8a, 8b, 8c, 8d (namely the sub-arrays 8a, 8b or 8c, 8d, etc. directly adjacent to the corresponding sense amplifier regions 10b, 10c).

The above-mentioned address (input into the semiconductor memory device 1 or the memory device controller 5, respectively) contains—other than with conventional semiconductor memory devices—as a further part of the above-mentioned further address parts—a corresponding number of (here e.g. four) bits RA<0:4> ("sub-array select bits" or "sub-bank address bits") serving to address, during the storing or reading out of data—within the arrays 3a, 3b, 3c, 3d specified by the "array select bits" or "bank address bits"—the respectively desired sub-array 8a, 8b, 8c, 8d or the respectively desired sub-bank 8a, 8b, 8c, 8d, respectively.

By the providing of a plurality of substantially independent sub-arrays 8a, 8b, 8c, 8d it can be achieved—as will be explained in more detail in the following—that corresponding write or read accesses can be performed—in parallel or overlapping in time—with a plurality of different sub-arrays 8a, 8b, 8c, 8d (as long as there is ensured that the corresponding sub-arrays 8a, 8b, 8c, 8d are not positioned side by side, i.e., are adjacent to one and the same sense amplifier region 10b, 10c (whose sense amplifiers are—as explained above—each assigned to both sub-arrays 8a, 8b, 8c, 8d adjacent to the corresponding sense amplifier region 10b, 10c, i.e. are adapted to read out—at a particular time—only the data from respectively one of the two adjacent sub-arrays 8a, 8b, 8c, 8d)).

As results from FIGS. 1 and 2, each array includes an array controller 6a, 6b, 6c, 6d (BC or "bank control") which is separately assigned to the respective array 3a, 3b, 3c, 3d and here is also substantially rectangular, and which is positioned adjacent to the above-mentioned decoding/data amplifier region 11 and a sub-array control region 7a, 7b, 7c, 7d (SBC or "sub-bank control") in a corner region of the respective array 3a, 3b, 3c, 3d—which will be explained in more detail in the following.

Figure 2:
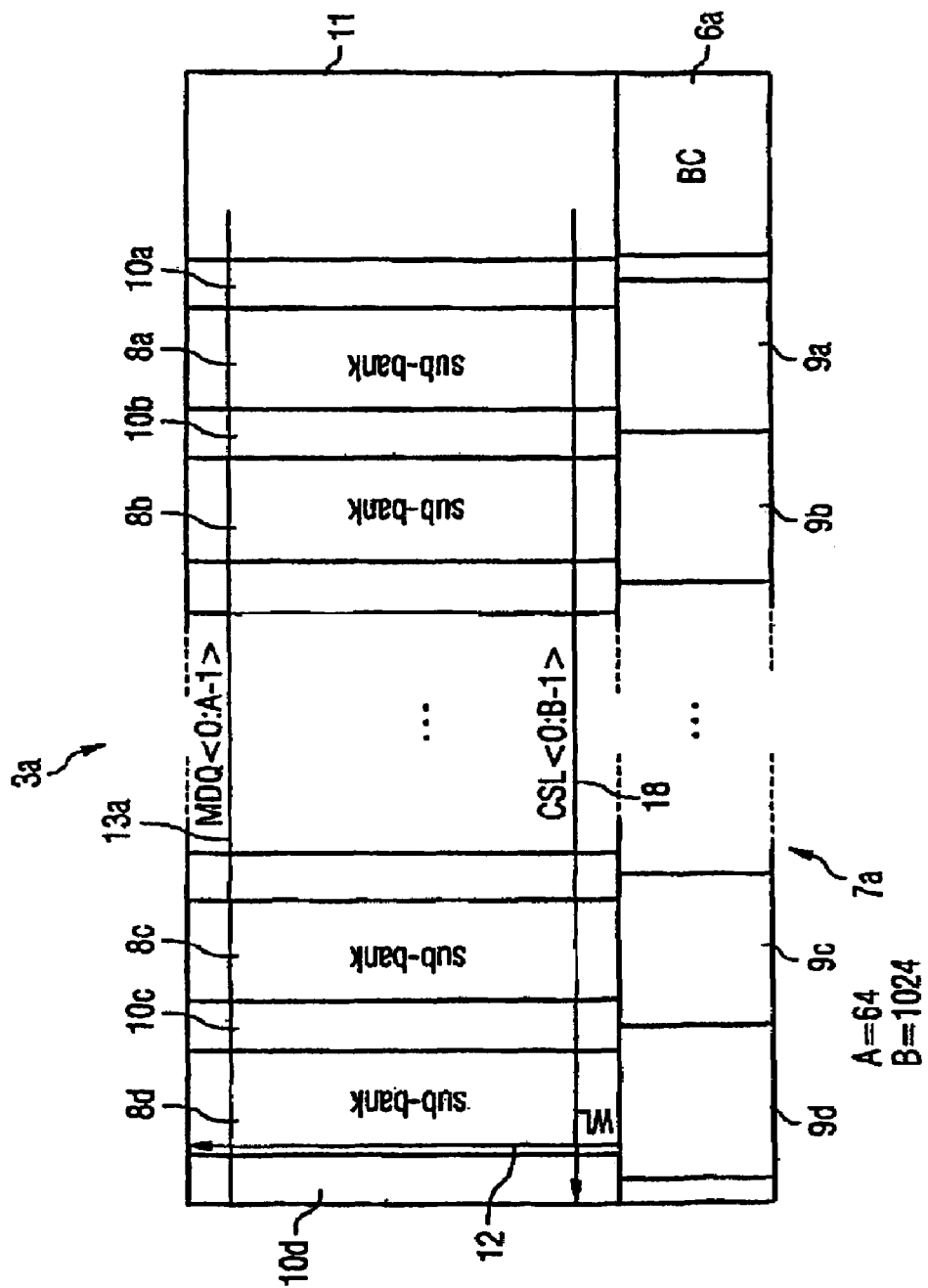
FIG. 2 illustrates a schematic detail representation of the structure of a section of one of the arrays of the semiconductor memory device illustrated in FIG. 1.

In accordance with FIG. 2, the sub-array control region 7a, 7b, 7c, 7d—which is positioned adjacent to the above-mentioned sub-arrays 8a, 8b, 8c, 8d and the sense amplifier regions 10a, 10b, 10c, 10d of an array 3a, 3b, 3c, 3d and is substantially rectangular—comprises a plurality of sub-array controllers 9a, 9b, 9c, 9d (here e.g., between 10 and 100, in particular between 20 and 70, for instance, between 30 and 40, e.g., 32) which are each separately assigned to a particular one of the above-mentioned sub-arrays 8a, 8b, 8c, 8d of an array 3a, 3b, 3c, 3d (and to the two respective sense amplifier regions 10a, 10b, 10c, 10d adjacent to the corresponding sub-array 8a, 8b, 8c, 8d and assigned thereto).

Each of the sub-array controllers 9a, 9b, 9c, 9d is of substantially identical structure and of substantially rectangular design, and is positioned adjacent to the respective sub-array 8a, 8b, 8c, 8d that is separately assigned to the respective sub-array controllers 9a, 9b, 9c, 9d, and to the two sense amplifier regions 10a, 10b, 10c, 10d respectively assigned thereto.

As results from FIG. 2, a plurality of word lines 12 extend within each sub-array 8a, 8b, 8c, 8d (starting from the corresponding sub-array controller 9a, 9b, 9c, 9d) (in FIG. 2, only one single word line, namely the word line WL, is illustrated for the sake of clearness). The number of word lines 12 provided per sub-array 8a, 8b, 8c, 8d may, for instance, correspond to the number of memory cell rows in the respective sub-array 8a, 8b, 8c, 8d (or e.g.,—for instance, in the case of the simultaneous reading out/storing of respectively several, e.g., 2, 4, or 8 bits—correspondingly to a fraction thereof (e.g., the half, a quarter, or an eighth)).

The individual word lines 12 are—equidistantly—arranged in parallel to each other (and extend in parallel to the outer edge of the respective sub-array 8a, 8b, 8c, 8d).

As results further from FIG. 2, a plurality of data lines 13, 13b (lines MDQ<0:A-1>, with e.g., A=64) extend—starting form the corresponding decoding/data amplifier region 11 of the respective array 3a—perpendicularly to the word lines 12 and across the corresponding sub-arrays 8a, 8b, 8b, 8d (and corresponding sense amplifier regions 10a, 10b, 10c e.g. positioned therebetween) of the respective array 3a (in FIG. 2, only one single MDQ line, namely the MDQ line 13a, is shown for the sake of clearness).

The MDQ lines 13a, 13b, etc. are adapted to address any sub-array 8a, 8b, 8c, 8d contained in the respective array 3a—irrespective of the respective address.

The individual MDQ lines 13a, 13b are—equidistantly—arranged in parallel to each other.

Figure 3:
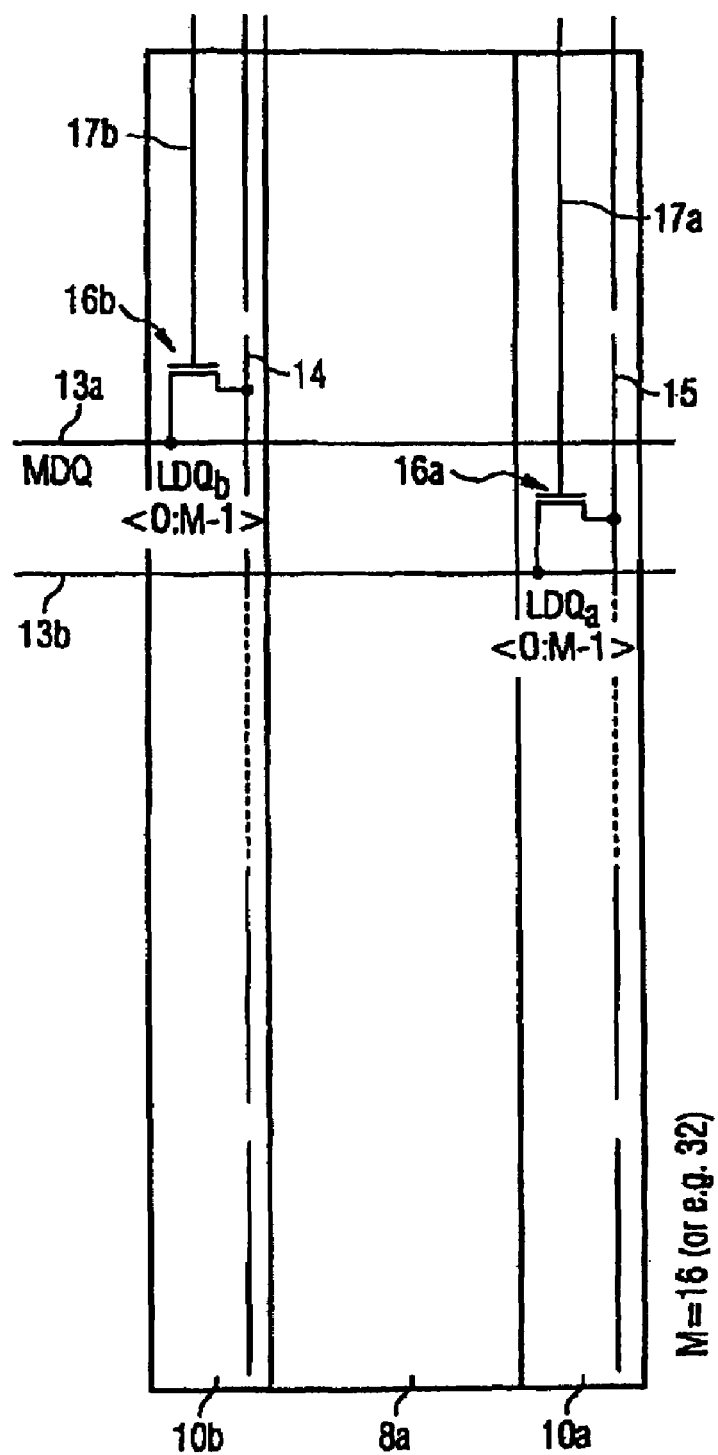
FIG. 3 illustrates a schematic detail representation of the structure of a partial section of the array section illustrated in FIG. 2.

In accordance with FIG. 3, a plurality of further data lines 14, 15 (LDQ lines 14, 15) extend within each sense amplifier region 10a, 10b of the corresponding array 3a—in parallel to the word lines 12 in the sub-arrays 8a positioned adjacent to the sense amplifier regions 10a, 10b, and transversely to the above-mentioned MDQ lines 13a, 13b (in FIG. 3, only two such lines 14, 15 are shown for the sake of clearness).

The number of LDQ lines 14, 15 provided per sense amplifier region 10a, 10b (e.g., the number of further data lines LDQa provided in the sense amplifier region 10a (line 15, etc.) and the number of further data lines LDQb provided in the sense amplifier region 10b (line 14, etc.), etc. can typically be relatively small (e.g., 2 or 4).

The length of an individual (or partial) line portion of the LDQ lines 14, 15 may substantially amount to a particular fraction of the length of the respective sense amplifier region 10a, 10b, e.g., approx. to 1/M (e.g., ¹/₁₆ or ¹/₃₂) of the respective sense amplifier region length.

The individual LDQ lines 14, 15 of a particular sense amplifier region 10a, 10b are—equidistantly—arranged in parallel to each other.

As results further from FIG. 3, all the LDQ lines 14, 15 positioned in a particular sense amplifier region 10a, 10b are connected via appropriate switches 16a, 16b (MDQ switch 16a, 16b) (here: via transistors 16a, 16b that are controllable via appropriate control lines 17a, 17b) to the MDQ lines 13a, 13b assigned to the corresponding sense amplifier region 10a, 10b (or the corresponding sub-array 8a, respectively).

Depending on whether the corresponding switch 16a, 16b is closed or open (or here: the corresponding transistor 16a, 16b used as a switch is—depending on the state of a control signal present at the corresponding control line 17a, 17b—in a conducting or a locked state), the corresponding LDQ line 14, 15 is conductively connected with the MDQ line 13a, 13b assigned thereto, or electrically disconnected therefrom.

As results from FIG. 2, a plurality of data or column select lines 18 (CSL lines 18) extend—starting from the corresponding decoding/data amplifier region 11 of the respective array 3a—across all sub-arrays 8a, 8b, 8c, 8d (and corresponding sense amplifier regions 10a, 10b, 10c positioned therebetween) of the respective array 3a (in FIG. 2, only one single CSL line, namely the CSL line 18, is shown for the sake of clearness).

The CSL lines 18 extend in parallel to the MDQ lines 13a, 13b and perpendicularly to the word lines 12 and the LDQ lines 14, 15. The individual CSL lines 18 are—equidistantly (and extending substantially over the entire region of the respective sub-arrays 8a, 8b, 8c, 8d or sense amplifier regions 10a, 10b, 10c)—arranged in parallel to each other.

The number B of the CSL lines 18 may, for instance, correspond to the number of memory cell columns in the respective array 3a or sub-array 8a, 8b, 8c, 8d (or e.g.,—for instance if a plurality of, e.g., 2, 4, or 8 bits are read out/stored simultaneously—correspondingly to a fraction thereof (e.g., the half, a quarter, or an eighth).

In the present embodiment, B=2048 CSL lines 18 may, for instance, apply.

The—central—memory device controller 5 ("memory controller") may—as is illustrated by way of example in FIG. 1—be designed as a separate semiconductor device communicating with the DRAM semiconductor memory device 1 via external pins.

Alternatively, the memory device controller 5 may, for instance, also be arranged on one and the same chip 1 as the above-mentioned memory cell arrays 3a, 3b, 3c, 3d (memory banks 0-3).

Figure 4:
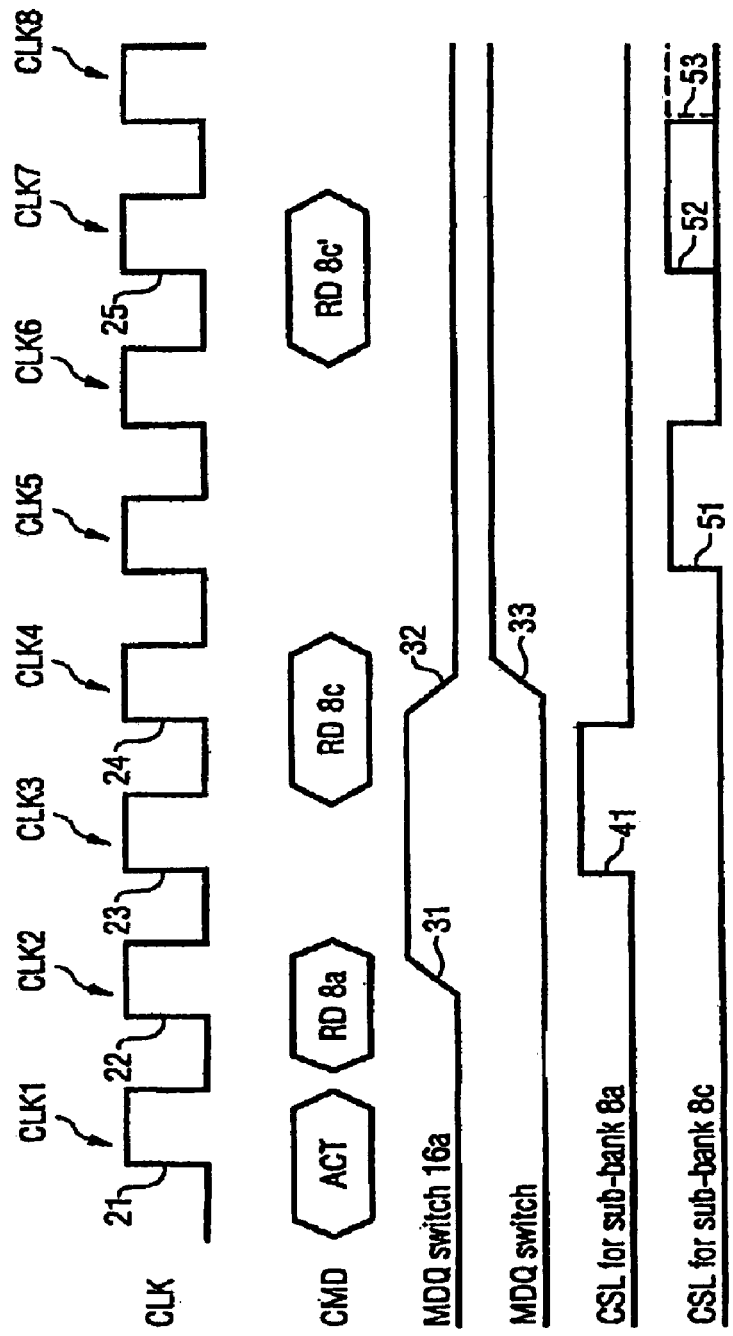
FIG. 4 illustrates a schematic timing diagram of signals used for controlling the arrays/sub-arrays illustrated in FIGS. 1, 2, and 3.

In order to perform a write or read access, a particular, predetermined, specific sequence of instructions is performed in the embodiment illustrated here:

First of all—as is, for instance, also illustrated in FIG. 4—by means of a word line or sub-array activate instruction (activate instruction (ACT)), a corresponding word line 12 or row of memory cells, respectively, assigned to a particular sub-array 8b, 8c, 8d, 8d determined by the above-mentioned address (in particular the above-mentioned "sub-array select bits" or "sub-bank address bits") of a particular array 3a, 3b, 3c, 3d—also determined by the above-mentioned address (in particular the above-mentioned "array select bits" or "bank address bits") (and also defined by the above-mentioned address, in particular the respective row address) is activated, or—alternatively—all word lines of the sub-array 8a, 8b, 8c, 8d defined by the "sub-array select bits" or "sub-bank address bits", respectively.

This is, for instance, performed in that—as is illustrated in FIG. 1—the memory device controller 5 sends, via a control line 4a, 4b, 4c, 4d assigned to the respective array 3a, 3b, 3c, 3d to be addressed (or to its array controller 6a, 6b, 6c, 6d, respectively) (or, alternatively, e.g. to all arrays 3a, 3b, 3c, 3d (or array controllers 6a, 6b, 6c, 6d) of the semiconductor memory device 1) a corresponding word line or sub-array activate instruction signal (ACT signal) (and—e.g., simultaneously—the above-mentioned address).

The address—in particular the row address (and/or the column address, and/or the "array select bits" or "bank address bits", and/or the "sub-array select bits" or "sub-bank address bits")—is buffered in a local memory (positioned in or close to the respective array 3a, 3b, 3c, 3d and assigned thereto), and/or—in particular the row address—in a further memory (positioned in or close to the sub-array controllers 9a, 9b, 9c, 9d and assigned thereto) (a buffering of the address—in particular the row address—in a central memory that is, for instance, positioned in or close to the memory device controller 5 and is assigned thereto, can or must be omitted—as results from the explanations below).

By the fact that—as has already been explained above—an address is used that is enlarged vis-à-vis conventionally used addresses by the above-mentioned "sub-array select bits" or "sub-bank address bits", in the present embodiment, by the emitting of a plurality of corresponding (successive) word line or sub-array activate instruction signals (ACT signals) in each array 3a, 3b, 3c, 3d (e.g., successively, in particular e.g. with successive clocks of the clock signal CLK), a plurality of word lines 12—positioned in different sub-arrays 8a, 8b, 8c, 8d of one and the same array 3a, 3b, 3c, 3d—or a plurality of different sub-arrays 8a, 8b, 8c, 8d of one and the same array 3a, 3b, 3c, 3d can be placed in an activated state and—in parallel—be left in the activated state (so that, with one and the same array 3a, 3b, 3c, 3d, a plurality of, e.g., more than 2, 4, 8, or 10, sub-arrays 8a, 8b, 8c, 8d—or corresponding word lines—are simultaneously in an activated state).

As has already been explained above, a plurality of sense amplifiers are arranged in each of the sense amplifier regions 10a, 10b, 10c, 10d of the respective array 3a, 3b, 3c, 3d, wherein the corresponding sense amplifiers (or, more exactly: the sense amplifiers arranged in the sense amplifier regions 10b, 10c positioned between two respective different sub-arrays 8a, 8b, 8c, 8d) are assigned to two respective different sub-arrays 8a, 8b, 8c, 8d (namely the respective sub-arrays 8a, 8b or 8c, 8d, etc. directly adjacent to the corresponding sense amplifier region 10b, 10c).

Therefore, it must be ensured (e.g., by the memory device controller 5) that word lines 12 are not activated—in parallel or simultaneously—which are assigned to two different sub-arrays 8a, 8b which, however, are adjacent to one and the same sense amplifier region 10b, 10c, or—in parallel or simultaneously—sub-arrays 8a, 8b adjacent to one and the same sense amplifier region 10b, 10c (but only respective word lines in at most every second sub-array 8a, 8c, here e.g., at most in 16 sub-arrays 8a, 8c, or at most every second sub-array 8a, 8c).

In reaction to the receipt of the above-mentioned word line or sub-array activate instruction signal (ACT signal), the respective array controller 6a, 6b, 6c, 6d provided separately for each array 3a, 3b, 3c, 3d and receiving the respective ACT instruction signal (or, alternatively: the corresponding sub-array controller 9a, 9b, 9c, 9d) initiates that the data values stored in the memory cells arranged in the sub-array 8a, 8b—defined by the above-mentioned "sub-array select bits" or "sub-bank address bits"—of the respective row—defined by the respective row address—are read out by the sense amplifiers of the respective sense amplifier region 10a, 10b assigned to the corresponding word line ("activated state" of the word line), or—alternatively—all the data values stored in all the memory cells of the sub-array 8a, 8b defined by the above-mentioned "sub-array select bits" or "sub-bank address bits" ("activated state" of the sub-array 8a, 8b).

As will be explained in more detail further below, this word line or this sub-array, respectively, is left in the activated state until an access is to be performed to a further word line of a further sub-array 8a, 8b (or to a further sub-array 8a, 8b) which is adjacent to one and the same sense amplifier region 10b, 10c as the sub-array 8a, 8b of the—above-explained—activated word line (or the activated sub-array 8a, 8b).

In other words, the word line or the sub-array 8a, 8b may be left in the activated state if an access to the same word line or to a word line arranged in the same sub-array 8a, 8b is to be performed later, or to a word line which is indeed arranged in the same array 3a, 3b, 3c, 3d as the activated word line or the activated sub-array 8a, 8b, but in a sub-array 8a, 8b that is not adjacent to one and the same sense amplifier region 10b, 10c as the activated sub-array 8a, 8b (or the sub-array 8a, 8b of the—above-explained—activated word line)—or if an access to a word line of another array 3a, 3b, 3c, 3d is to be performed.

As long as the word line or the sub-array 8a, 8b is left in the above-mentioned activated state, the memory device controller 5 of the semiconductor memory device 1 does not send any corresponding word line or sub-array deactivate instruction signal (precharge or PRE instruction signal) characterizing the word line to be deactivated or the sub-array to be deactivated with a corresponding address.

As results from FIG. 4, in the clock CLK2 which is directly following the clock CLK1 (or the positive clock edge 21) at which the above-mentioned word line or sub-array activate instruction signal (ACT signal) was sent (or was present in a stable manner), the memory device controller 5 sends, via a control line assigned to the respective array 3a, 3b, 3c, 3d to be addressed (or its array controller 6a, 6b, 6c, 6d, respectively) (or, alternatively, e.g. to all the arrays 3a, 3b, 3c, 3d (or array-controllers 6a, 6b, 6c, 6d) of the semiconductor memory device 1), a corresponding read or write instruction signal (RD or WT instruction signal) (which—at the clock edge 22 which is directly following the clock edge 21—is present in a stable manner at the corresponding control line (here e.g., a "RD8a" signal addressing the sub-array 8a).

Together with the read or write instruction signal (RD or WT instruction signal), the above-mentioned "sub-array select bits" and/or the column address can be emitted by the memory device controller 5 (or, alternatively: the array or sub-array controller 6a, 9a, 9b, 9c, 9d) (or be read out from the above-mentioned memory device).

In reaction to the receipt of the above-mentioned read or write instruction signal (RD or WT instruction signal), the respective array controller 6a, 6b, 6c, 6d provided separately for each array 3a, 3b, 3c, 3d and receiving the respective RD (or WT) instruction signal (or, alternatively: the corresponding sub-array controller 9a, 9b, 9c, 9d) initiates that the MDQ switch(es) 16a defined by the column address (or, alternatively, all the MDQ switches 16a) of the sense amplifier region 10a defined by the "sub-array select bits" or the "sub-bank address bits" (or of the sense amplifier region 10a assigned to the sub-array 8a defined by the "sub-array select bits" or the "sub-bank address bits") is/are closed or placed in a conductive state, i.e., is/are activated (e.g., by applying a corresponding control signal to the corresponding control line(s) 17a).

Thus, the corresponding LDQ line(s) 16 is/are conductively connected with the assigned MDQ line(s) 13a, 13b (i.e., activated).

By the—relatively early—activating of the corresponding MDQ switch(es) 16a it is ensured that—even with relatively great signal delay times—the corresponding MDQ switch(es) 16a is/are in the above-mentioned closed or conductive state in time—i.e., at the latest by the next clock CLK3 (or at the next, positive clock edge 23) (cf. e.g., also the (first) change of state 31 of the MDQ switch 16a illustrated in FIG. 4).

If—from previous cycles—one or a plurality of MDQ switch(es) (differing from the above-mentioned—newly activated—MDQ switch(es) 16a) should still be activated in the corresponding array 3a, 3b, 3c, 3d, it is/they are—simultaneously with the activating of the above-mentioned MDQ switch(es) 16a—deactivated, i.e., placed in an open or locked state (e.g., again controlled by the corresponding array controller 6a, 6b, 6c, 6d (or, alternatively: the corresponding sub-array controller 9a, 9b, 9c, 9d), for instance, by applying corresponding control signals to the corresponding control lines connected to the MDQ switches to be deactivated).

Next, in the clock CLK3 which is directly following the clock CLK2 (or the positive clock edge 22) at which the above-mentioned read or write instruction signal (RD or WT instruction signal) was sent (or was present in a stable manner), the corresponding array controller 6a, 6b, 6c, 6d (or, alternatively: the corresponding sub-array controller 9a, 9b, 9c, 9d) initiates that corresponding control signals are output at the corresponding CSL line(s) 18 which is/are exactly specified by the corresponding column address (cf. e.g., the change of state 41 of the corresponding signal illustrated in FIG. 4), said control signals resulting in that the sense amplifier(s) addressed thereby—and possibly by the row address buffered in the corresponding local memory—correspondingly output(s) the corresponding—previously read-out—data (or that the corresponding data are read into the corresponding memory cell(s)).

The data output by the corresponding sense amplifier(s) are fed to the corresponding LDQ line(s) 15 and—via the corresponding (closed—as has been explained above) MDQ switch(es) 16a and the corresponding MDQ line(s)—transmitted to the above-mentioned decoding/data amplifier region 11. There, the data (or the corresponding data signals, respectively) may possibly be further amplified and then be output at the corresponding data pin(s) of the semiconductor memory device 1.

If a further sub-array (e.g., the sub-array 8c)—which has already been activated by a corresponding ACT signal (as described above)—is to be accessed later, the memory device controller 5 directly (here: at a clock CLK4)—as results e.g. from FIG. 4—sends, via a control line assigned to the respective array 3a, 3b, 3c, 3d to be addressed (or its array controller 6a, 6b, 6c, 6d, respectively) (or, alternatively, e.g., to all the arrays 3a, 3b, 3c, 3d (or array-controllers 6a, 6b, 6c, 6d) of the semiconductor memory device 1) a corresponding read or write instruction signal (RD or WT instruction signal) (which—at the corresponding clock edge 24—is present in a stable manner at the corresponding control line) (here e.g., a "RD8c" signal addressing the sub-array 8c).

Together with the read or write instruction signal (RD or WT instruction signal), the memory device controller 5 can emit the corresponding address, in particular the corresponding "array" and "sub-array select bits", the row and column address, etc.

In reaction to the receipt of the above-mentioned read or write instruction signal (RD or WT instruction signal), the respective array controller 6a, 6b, 6c, 6d provided separately for each array 3a, 3b, 3c, 3d and receiving the respective RD (or WT) instruction signal (or, alternatively: the corresponding sub-array controller 9a, 9b, 9c, 9d) initiates that the MDQ switch(es) defined by the column address (or, alternatively, all the MDQ switches) of the sense amplifier region 10c defined by the "sub-array select bits" or the "sub-bank address bits" (or of the sense amplifier region 10c assigned to the sub-array 8c defined by the "sub-array select bits" or the "sub-bank address bits") is/are closed or placed in a conductive state, i.e., is/are activated (e.g., by applying a corresponding control signal to the corresponding control line(s)).

Thus, the corresponding LDQ line(s) 15 is/are conductively connected with the assigned MDQ line(s) 13a, 13b (i.e., activated) (cf. e.g., also the change of state 33 of the corresponding MDQ switch illustrated in FIG. 4).

If—from previous cycles—one or a plurality of MDQ switch(es) (differing from the above-mentioned—newly activated—MDQ switch(es)) should still be activated in the corresponding array 3a, 3b, 3c, 3d (here e.g., the switch(es) 16a), it is/they are—simultaneously with the activating of the above-mentioned MDQ switch(es)—deactivated, i.e., placed in an open or locked state (e.g. again controlled by the corresponding array controller 6a, 6b, 6c, 6d (or, alternatively: the corresponding sub-array controller 9a, 9b, 9c, 9d), for instance, by applying corresponding control signals to the corresponding control lines 17a connected to the MDQ switches 16a to be deactivated) (cf. e.g., also the (second) change of state 32 of the corresponding MDQ switch 16a illustrated in FIG. 4).

Next, in the clock CLK5 which is directly following the clock CLK4 (or the positive clock edge 24) at which the above-mentioned read or write instruction signal (RD or WT instruction signal) was sent (or was present in a stable manner), the corresponding array controller 6a, 6b, 6c, 6d (or, alternatively: the corresponding sub-array controller 9a, 9b, 9c, 9d) initiates that corresponding control signals are output at the corresponding CSL line(s) 18 which is/are exactly specified by the corresponding column address stored in the above-mentioned memory device (cf. e.g., the change of state 51 of the corresponding signal illustrated in FIG. 4), said control signals resulting in that the sense amplifier(s) addressed thereby—and possibly by the row address buffered in the corresponding local memory—correspondingly output(s) the corresponding—previously read-out—data (or that the corresponding data are read into the corresponding memory cell(s)).

The data output by the corresponding sense amplifier(s) are fed to the corresponding LDQ line(s) 15 and—via the corresponding (closed—as has been explained above) MDQ switch(es) and the corresponding MDQ line(s)—transmitted to the above-mentioned decoding/data amplifier region 11. There, the data (or the corresponding data signals, respectively) may possibly be further amplified and then be output at the corresponding data pin(s) of the semiconductor memory device 1.

If—without another sub-array having been accessed in the same array 3a in which the sub-array 8c is positioned which has been accessed last—the sub-array 8c which has been accessed last is to be accessed again, the memory device controller 5 directly (here: at a clock CLK7) sends—as results e.g., from FIG. 4—, via a control line assigned to the respective array 3a, 3b, 3c, 3d to be addressed (or its array controller 6a, 6b, 6c, 6d, respectively) (or, alternatively, e.g. to all the arrays 3a, 3b, 3c, 3d (or array controllers 6a, 6b, 6c, 6d) of the semiconductor memory device 1), a corresponding read or write instruction signal (RD or WT instruction signal) (which—at the corresponding clock edge 25—is present in a stable manner at the corresponding control line) (here e.g., a "RD8c" signal which again addresses the sub-array 8c (that has already been addressed last).

Together with the read or write instruction signal (RD or WT instruction signal), the memory device controller 5 can emit the corresponding address, in particular the corresponding "array" and "sub-array select bits", the row and column address, etc.

Since—from the previous access—the MDQ switch(es) defined by the column address (or, alternatively, all the MDQ switches) of the sense amplifier region 10c defined by the "sub-array select bits" or the "sub-bank address bits" (or the sense amplifier region 10c assigned to the sub-array 8c defined by the "sub-array select bits" or the "sub-bank address bits") has/have already been closed or been placed in a conductive state, i.e., activated, the corresponding array controller 6a, 6b, 6c, 6d (or, alternatively: the corresponding sub-array controller 9a, 9b, 9c, 9d) can initiate directly—i.e., even during the same clock CLK7 at which the corresponding read or write signal (here: the signal RD8c') was sent—that corresponding control signals are output at the corresponding CSL line(s) 18 that are exactly specified by the corresponding column address (cf. e.g., the change of state 52 of the corresponding signal illustrated in FIG. 4), said control signals resulting in that the sense amplifier(s) addressed thereby— and by the row address—correspondingly output(s) the corresponding—previously read-out—data (or that the corresponding data are read into the corresponding memory cell (s)).

Alternatively, the control signals output in reaction to the corresponding read (RD) or write (WT) instruction signal (here: the RD8c' signal) can—correspondingly similar as described above with respect to the RD8a and the RD8c signal—also be output one clock later (here: at the clock CLK8) (cf. e.g. the change of state 53 of the corresponding signal illustrated in dashed lines in FIG. 4). The result of this is that the sense amplifier(s) addressed thereby correspondingly output(s) the corresponding—previously read-out— data one clock later than previously described (or that the corresponding data are read into the corresponding memory cell(s) one clock later).

The data output by the corresponding sense amplifier(s) are fed to the corresponding LDQ line(s) 15 and—via the corresponding (closed—as has been explained above) MDQ switch(es) and the corresponding MDQ line(s)—transmitted to the above-mentioned decoding/data amplifier region 11. There, the data (or the corresponding data signals, respectively) may possibly be further amplified and then be output at the corresponding data pin(s) of the semiconductor memory device 1.

Only if an access to a word line of a sub-array 8a, 8b or to a sub-array 8a, 8b, respectively, is to be performed which is adjacent to one and the same sense amplifier region 10b, 10c as a sub-array 8a, 8b that has already been activated (or the sub-array 8a, 8b of a word line that has already been activated) must the corresponding—activated—sub-array 8a, 8b be deactivated prior to the corresponding access to the corresponding word line (that has not yet been activated) or the corresponding sub-array (that has not yet been activated).

This is, for instance, effected in that—as is illustrated in FIG. 1—the memory device controller 5 sends, via a control line 4a, 4b, 4c, 4d assigned to the respective array 3a, 3b, 3c, 3d to be addressed (or its array controller 6a, 6b, 6c, 6d, respectively) (or, alternatively, e.g., to all the arrays 3a, 3b, 3c, 3d (or array controllers 6a, 6b, 6c, 6d) of the semiconductor memory device 1), a corresponding word line or sub-array deactivate instruction signal (PRE or pre-charge signal) (and—e.g., simultaneously—the corresponding address, in particular the "sub-array select bits" or "sub-bank address bits" specifying the sub-array 8a, 8b to be deactivated (and the "array select bits" or "bank address bits" specifying the corresponding array 3a, 3b (or possibly the row address specifying the word line to be deactivated, etc.))).

In reaction to the receipt of the corresponding word line or sub-array deactivate instruction signal (PRE signal), the corresponding array controller 6a, 6b, 6c, 6d (or, alternatively, the corresponding sub-array controller 9a, 9b, 9c, 9d) initiates that the corresponding word line (or the corresponding sub-array 8a, 8b) is deactivated, so that the corresponding word line of the sub-array 8a, 8b or the sub-array 8a, 8b, respectively, adjacent to one and the same sense amplifier region 10b, 10c as the—now deactivated—sub-array 8a, 8b is prepared for the word line or sub-array activate instruction (ACT) following in the next clock and addressing the corresponding sub-array 8a, 8b.

The invention claimed is:

1. A method for operating a semiconductor memory device comprising:
    defining the semiconductor memory device to include a plurality of memory cell arrays each comprising a plurality of memory cell sub-arrays;
    activating a first memory cell sub-array or memory cells of the first memory cell sub-array that are contained in a first set of memory cells, including memory cells positioned in one and the same row or column of the first memory cell sub-array, if one or a plurality of memory cells contained in the first memory cell sub-array or in the first set of memory cells is/are to be accessed;
    accessing the corresponding memory cell or memory cells; and
    leaving the first memory cell sub-array or the memory cells of the first memory cell sub-array that are contained in the first set of memory cells in the activated state if one or a plurality of further memory cells is/are to be accessed which are contained in a second memory cell sub-array of the same memory cell array that comprises the first memory cell sub-array.

2. The method according to claim 1, comprising wherein, for activating the first memory cell sub-array or the memory cells of the first memory cell sub-array that are contained in the first set of memory cells, an activate signal is used.

3. The method according to claim 1, comprising wherein, if one or a plurality of further memory cells are to be accessed which are contained in a third memory cell sub-array of the same memory cell array that comprises the first and the second memory cell sub-array, the first memory cell sub-array or the memory cells of the first memory cell sub-array that are contained in the first set of memory cells are deactivated.

4. The method according to claim 3, comprising wherein the first memory cell sub-array or the memory cells of the first memory cell sub-array that are contained in the first set of memory cells are deactivated if the third memory cell sub-array uses means, which can also be used by the first memory cell sub-array, and wherein the first memory cell sub-array or the memory cells of the first memory cell sub-array that are contained in the first set of memory cells are left in the activated state if the means, used by the third memory cell sub-array are not used or cannot be used by the first memory cell sub-array.

5. The method according to claim 4, comprising wherein the means is a sense amplifier means.

6. The method according to claim 5, comprising wherein, in reaction to the activate signal, the sense amplifier means used by the first memory cell sub-array read out the data stored in the first set of memory cells or in the memory cells of the first memory cell sub-array.

7. The method according to claim 6, comprising wherein, in reaction to a read signal output after the activate signal, corresponding switches are first of all closed, so that lines that are connected with the sense amplifier means are connected with corresponding data input/output lines of the first memory cell sub-array, and wherein sense amplifier means that are selected by a select signal then output the data read out by same, in particular via the lines and the data input/output lines.

8. The method for device according to any of claim 1, which comprises a plurality of memory cell arrays each comprising a plurality of memory cell sub-arrays, wherein the method further comprises:

activating memory cells of a first memory cell sub-array that are contained in a first set of memory cells if one or a plurality of the memory cells contained in the first set of memory cells is/are to be accessed;

accessing the corresponding memory cell or memory cells; and leaving the memory cells of the first memory cell sub-array that are contained in the first set of memory cells in the activated state if one or a plurality of further memory cells is/are to be accessed which are contained in a second memory cell sub-array of the same memory cell array that comprises the first memory cell sub-array, beyond the beginning or the end, respectively, of the access to the one or the plurality of further memory cells, if sense amplifier means used by the second memory cell sub-array are not used by the first memory cell sub-array.

9. The method according to claim 8, the method additionally comprising:

deactivating the memory cells of the first memory cell sub-array that are contained in the first set of memory cells only if one or a plurality of additional memory cells is/are to be accessed which are contained in a third memory cell sub-array of the same memory cell array that comprises the first memory cell sub-array if sense amplifier means used by the third memory cell sub-array are also used by the first memory cell sub-array.

10. A semiconductor memory device comprising:

a plurality of memory cell arrays each comprising a plurality of memory cell sub-arrays;

a controller for activating a first memory cell sub-array or memory cells of the first memory cell sub-array that are contained in a first set of memory cells, in particular of memory cells positioned in one and the same row or column of the first memory cell sub-array, if one or a plurality of memory cells contained in the first memory cell sub-array or in the first set of memory cells is/are to be accessed; and wherein the controller is designed such that it leaves the first memory cell sub-array or the memory cells of the first memory cell sub-array that are contained in the first set of memory cells in the activated state if one or a plurality of further memory cells are to be accessed which are contained in a second memory cell sub-array of the same memory cell array that comprises the first memory cell sub-array.

11. The semiconductor memory device according to claim 10, wherein the controller, in particular an array and/or sub-array controller, is designed such that it deactivates the first memory cell sub-array or the memory cells of the first memory cell sub-array that are contained in the first set of memory cells if one or a plurality of further memory cells are to be accessed which is/are contained in a third memory cell sub-array of the same memory cell array that comprises the first and the second memory cell sub-array.

12. A method for operating a semiconductor memory device comprising:

defining the semiconductor memory device to include a plurality of memory cell arrays each comprising a plurality of memory cell sub-arrays;

activating a first memory cell sub-array or memory cells including memory cells positioned in one and the same row or column of the first memory cell sub-array, if one or a plurality of memory cells contained in the first memory cell sub-array or in the first set of memory cells is/are to be accessed;

accessing the corresponding memory cell or memory cells;

leaving the activated memory cells of the first memory cell sub-array in the activated state if one or a plurality of further memory cells are to be accessed which are contained in a second memory cell sub-array of the same memory cell array that comprises the first memory cell sub-array.

13. The method according to claim 12, comprising wherein, if one or a plurality of further memory cells are to be accessed which are contained in a third memory cell sub-array of the same memory cell array that comprises the first and the second memory cell sub-array, the first memory cell sub-array or the memory cells of the first memory cell sub-array that are contained in the first set of memory cells are deactivated.

14. The method according to claim 13, wherein the first memory cell sub-array or the memory cells of the first memory cell sub-array that are contained in the first set of memory cells are deactivated if the third memory cell sub-array uses means, in particular sense amplifier means, which can also be used by the first memory cell sub-array, and wherein the first memory cell sub-array or the memory cells of the first memory cell sub-array that are contained in the first set of memory cells are left in the activated state if the means, in particular sense amplifier means, used by the third memory cell sub-array are not used or cannot be used by the first memory cell sub-array.

15. The method according to claim 14 comprising wherein, for activating the first memory cell sub-array or the memory cells of the first memory cell sub-array that are contained in the first set of memory cells, an activate signal is used.

16. The method according to claim 15, comprising wherein, in reaction to the activate signal, the sense amplifier means used by the first memory cell sub-array read out the data stored in the first set of memory cells or in the memory cells of the first memory cell sub-array.

17. The method according to claim 16, comprising wherein, in reaction to a read signal output after the activate signal, corresponding switches are first of all closed, so that lines that are connected with the sense amplifier means are connected with corresponding data input/output lines of the first memory cell sub-array, and wherein sense amplifier means that are selected by a select signal then output the data read out by same, in particular via the lines and the data input/output lines.

18. A semiconductor memory device comprising:
a plurality of memory cell arrays each comprising a plurality of memory cell sub-arrays;
a controller for activating memory cells of a first memory cell sub-array, in particular of memory cells positioned in one and the same row or column of the first memory cell sub-array, if one or a plurality of memory cells contained in the first memory cell sub-array are to be accessed; and
wherein the controller is designed such that it leaves the first memory cell sub-array or the memory cells of the first memory cell sub-array that are contained in the first set of memory cells in the activated state if one or a plurality of further memory cells are to be accessed which are contained in a second memory cell sub-array of the same memory cell array that comprises the first memory cell sub-array.

19. The semiconductor memory device according to claim 18, wherein the controller, is designed such that it deactivates the first memory cell sub-array or the memory cells of the first memory cell sub-array if one or a plurality of further memory cells are to be accessed which are contained in a third memory cell sub-array of the same memory cell array that comprises the first and the second memory cell sub-array.

20. A semiconductor memory device comprising:
a plurality of memory cell arrays each comprising a plurality of memory cell sub-arrays;
control means for activating memory cells of a first memory cell sub-array, in particular of memory cells positioned in one and the same row or column of the first memory cell sub-array, if one or a plurality of memory cells contained in the first memory cell sub-array are to be accessed; and
wherein the control means is designed such that it leaves the first memory cell sub-array or the memory cells of the first memory cell sub-array that are contained in the first set of memory cells in the activated state if one or a plurality of further memory cells are to be accessed which are contained in a second memory cell sub-array of the same memory cell array that comprises the first memory cell sub-array.

* * * * *